(12) United States Patent
Yonezawa et al.

(10) Patent No.: US 7,281,334 B2
(45) Date of Patent: Oct. 16, 2007

(54) MECHANICAL SCRIBING APPARATUS WITH CONTROLLING FORCE OF A SCRIBING CUTTER

(76) Inventors: Satoshi Yonezawa, c/o 10 Branch 1, 1-chome, Shinsayama, Sayama-shi (JP); Hirashi Ueda, c/o 10 Branch 1, 1-chome, Shinsayama, Sayama-shi (JP)

( * ) Notice: Subject to any disclaimer, the term of this patent is extended or adjusted under 35 U.S.C. 154(b) by 63 days.

(21) Appl. No.: 11/077,139

(22) Filed: Mar. 7, 2005

(65) Prior Publication Data

US 2005/0223570 A1   Oct. 13, 2005

(30) Foreign Application Priority Data

Sep. 26, 2002  (JP) .............................. 2002-319028
Sep. 1, 2003   (JP) ......................... PCT/JP03/11140

(51) Int. Cl.
  *B43L 13/00*  (2006.01)
(52) U.S. Cl. ............................. 33/18.1; 33/20.1; 83/74
(58) Field of Classification Search ................ 33/18.1, 33/20.1, 32.1, 32.3; 409/304, 288–289; 438/68, 438/113, 460–465; 83/62.1, 72, 74, 522.27, 83/881
See application file for complete search history.

(56) References Cited

U.S. PATENT DOCUMENTS

| 3,379,814 | A | * | 4/1968 | Bracey, Jr. ................ 264/322 |
| 3,680,213 | A | * | 8/1972 | Reichert ..................... 33/18.1 |
| 4,502,225 | A | * | 3/1985 | Lin ............................ 33/18.1 |
| 4,589,194 | A | * | 5/1986 | Roy ............................. 83/875 |
| 5,115,403 | A | * | 5/1992 | Yoneda et al. .............. 700/173 |
| 5,251,156 | A | * | 10/1993 | Heier et al. ................. 702/167 |
| 5,615,489 | A | * | 4/1997 | Breyer et al. ................ 33/503 |
| 5,820,006 | A | * | 10/1998 | Turner ......................... 225/96 |
| 5,956,253 | A | * | 9/1999 | Gottschalk .................. 700/186 |
| 6,195,618 | B1 | * | 2/2001 | Rosenberg et al. ......... 702/152 |
| 6,319,747 | B1 | * | 11/2001 | Todisco et al. ............... 438/94 |
| 6,422,793 | B1 | * | 7/2002 | Todisco et al. ............. 409/304 |
| 6,927,863 | B2 | * | 8/2005 | Gurny ......................... 356/602 |
| 6,934,443 | B2 | * | 8/2005 | Hikichi et al. ................ 385/31 |
| 7,165,331 | B1 | * | 1/2007 | Lindsey et al. ............. 33/18.1 |

FOREIGN PATENT DOCUMENTS

JP    11-312815       11/1999
JP    2002018482 A  *  8/2000

* cited by examiner

*Primary Examiner*—G. Bradley Bennett
*Assistant Examiner*—Tania C Courson

(57) ABSTRACT

A mechanical scribing apparatus with controlling force of a scribing cutter for adaptively separating each unit of thin film solar cells formed on a single substrate, which is always capable of performing a predetermined minute scribing of a work in accordance with a wear loss of a scribing cutter. This apparatus is provided with a scribing means for placing a scribing cutter having a cylindrical body tapered at a specified tapering angle and having a flat tip face at a specified surface position of the work, pressing the cutter with a specified pressure force to the surface of the work and moving the cutter on the surface of the work, a means for measuring the size of a flat tip face of the scribing cutter and a means for variably controlling the pressure force of the scribing cutter in accordance with the measured size of the flat tip face of the cutter.

6 Claims, 5 Drawing Sheets

MECHANICAL SCRIBING APPARATUS WITH CONTROLLING FORCE OF A SCRIBING CUTTER

BACKGROUND OF THE INVENTION

1. Field of the Invention

The present invention relates to a mechanical scribing apparatus with controlling force of a scribing cutter for scribing a surface of a work with a scribing tool and, more specifically, to a mechanical scribing apparatus with controlling force of a scribing cutter most suited for scribing thin films of number of cells arranged on a substrate for electrically separating unit cells from each other in the process of fabricating a thin-film solar cell.

2. Description of the Related Art

Recently, there has been developed a thin-film solar cell having a light absorbing layer made of chalcopyrite compound (CIGS (Cu(InGn)Se2) type compound), which possesses an excellent power conversion efficiency and high stability of output characteristic.

FIG. 1 shows a structure of a CIGS thin-film solar cell. It comprises a SLG (soda lime glass) substrate 1 on which a lower molybdenum (Mo) electrode layer (positive electrode) 2, a CIGS-type light absorbing layer 3, a buffer layer 4 of ZnS and a transparent upper electrode layer (negative electrode) 6 of ZnO:Al are subsequently formed in the described order. In FIG. 1, there is shown a positive side output electrode 7 and a negative side output electrode 8.

In mass production of the thin-film compound semiconductor solar cells, there is used such a modular structure in which a plurality of the above-described unit cell structures are monolithically formed on a single substrate. The unit cells monolithically formed on the substrate therefore must be electrically separated from each others.

In the conventional process, the electrical separation of unit cells can be easily carried out by partially removing thin films between respective cells by laser scribing method (JP H11-312815). However, the laser scribing method may concurrently heat boundaries of respective cells at a very high temperature, resulting in deterioration of characteristics of cells by the effect of heat.

Thus, the separation of thin film solar cells on a single substrate by laser scribing involves a problem of deterioration of performance characteristic of respective cells by the effect of the high heat energy of a laser beam.

SUMMARY OF THE INVENTION

A primary object of the present invention is to provide a mechanical scribing apparatus with controlling force of a scribing cutter best suited to separate respective solar cells formed on a single substrate by vertically pressing at a specified force a flat tip face of a scribing cutter having a specifically tapered cylindrical body to the surface of a work and moving the cutter on the surface of the work to form a scribing line with no effect of heat that may cause the deterioration of the characteristic of respective solar cells.

Another object of the present invention is to provide a mechanical scribing apparatus with controlling force of a scribing cutter for mechanically scribing respective solar cells monolithically formed on a single substrate, which is provided with means for preventing respective solar cells from insufficiently being scribed by using a scribing cutter having wear tip face, which may cause short circuiting among the cells, and means for preventing the solar cells from being excessively cut by applying an excessive force to the scribing cutter having a wear tip face, which may form deep damage to the under layers and the substrate.

Practically, the mechanical scribing apparatus with controlling force of a scribing cutter according to the present invention is provided with a means for measuring a flat tip face of the scribing cutter and a means for controlling a force pressing the cutter in accordance with the measured size of the tip face of the cutter, thereby achieving minute scribing of respective solar cells according to a predetermined cutting pattern in accordance with a wear loss state of the tip face of the scribing cutter.

PREFERRED EMBODIMENT OF THE INVENTION

Figure 1:
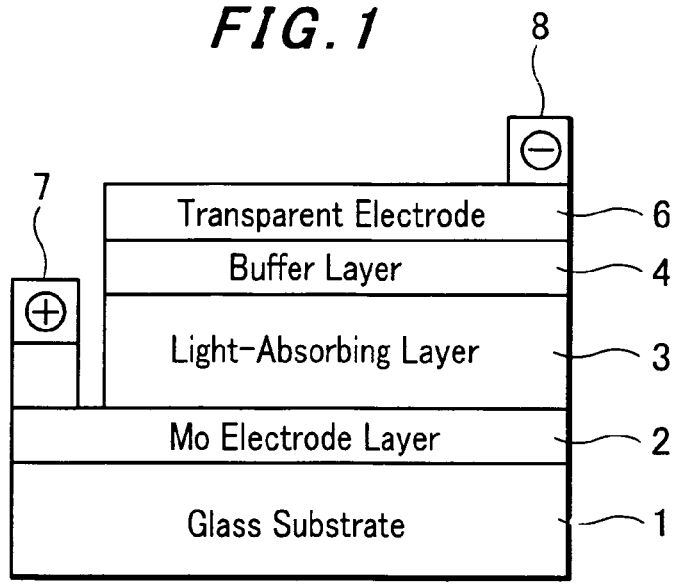
FIG. 1 is a front sectional illustration of a structure of a thin film solar cell of general CIGS compound.
Figure 2:
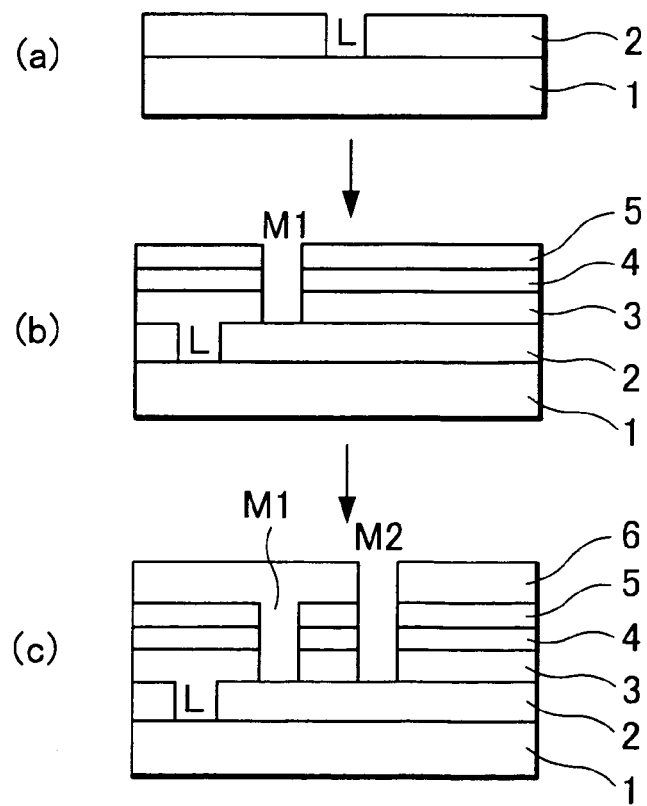
FIG. 2 illustrates a basic process of mechanical scribing when fabricating thin film solar cells.

In FIG. 2, there is shown a basic process of mechanical scribing in the production of compound thin-film solar cells formed on a single substrate.

As shown in FIG. 2(a), the first process is to form a lower molybdenum (Mo) electrode layer 2 by sputtering on a SLG (soda lime glass) substrate 1 and then a separating groove L is formed by laser scribing in the Mo-electrode layer formed on the substrate. In this stage, the laser scribing has no significant influence by heat on the performance of the solar cell products. Next, as shown in FIG. 2(b), the second process is to form a compound semiconductor film (CIGS) light absorbing layer 3 on the lower Mo-electrode layer 2, a ZnS buffer layer 4 for providing hetero-junction by a chemical bath deposition (CBD) method and a ZnO insulating layer 5 by a sputtering method on the buffer layer 4 and then form a groove M1 for forming a contact between the upper and lower electrode layers by mechanical scribing of the layers in depth to the surface of the lower Mo-electrode layer 2 at a position horizontally apart by several hundred μm from the groove L made for separating the lower electrodes.

The light absorbing layer 3 is a CIGS film which is fabricated as a stacked metal precursor formed by sputtering, e.g., an indium (In) layer and a copper gallium (Cu—Ga) alloy layer and heat-treated in the atmosphere of selenium (Se).

Finally, the third process is conducted, as shown in FIG. 2(c), by forming an upper transparent electrode layer 6 of a ZnO:Al on the insulating layer 5 and then by forming by the mechanical scribing method a groove M2 in depth to the surface of the lower Mo-electrode layer for separating the upper and lower electrode layers.

The grooves M1 and M2 must not be made by the laser scribing method which, if applied, may cause deterioration of the photoelectric conversion characteristic of the light-absorbing layer 3 of the solar cell product.

Figure 3:
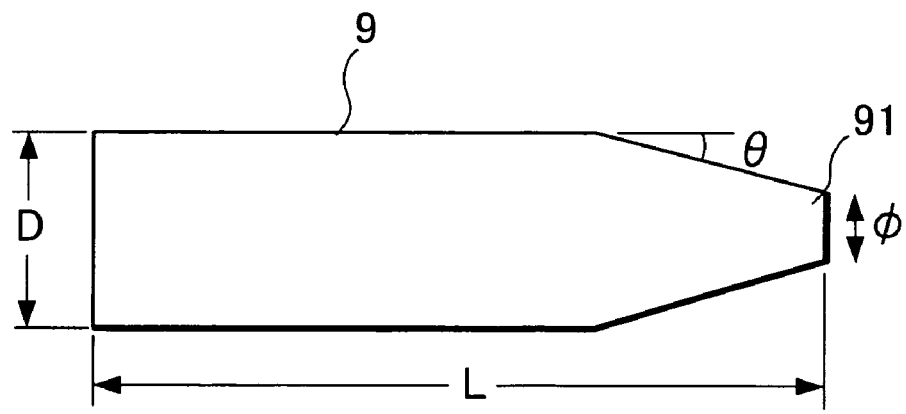
FIG. 3 is a front view of a scribing cutter.

FIG. 3 illustrates a scribing cutter 9 of the mechanical scribing apparatus. The cutter has a cylindrical body of 3 mm in diameter D and of 4 cm in length L, which body has a cylindrical surface tapering at an angle θ of 60° to the axis and a flat tip face of 35 μm in diameter φ. In practice, the mechanical scribing apparatus cuts the grooves M1 and M2 by applying a specified pressure force to the cutter 9 perpendicularly placed to a specified position of the surface of the work and moving the same cutter thereon.

Figure 4:
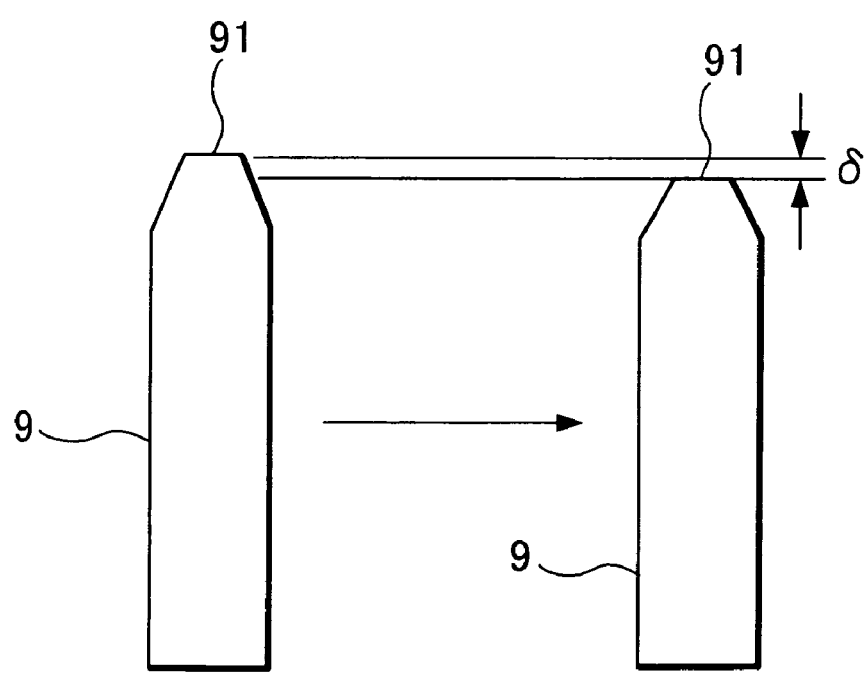
FIG. 4 illustrates a change in size of a flat tip face of a mechanical scribing cutter.

If the cutter 9 has a wear loss (δ) of the flat-tip face as shown in FIG. 4, it cannot remove the necessary amount by scribing to the depth of the grooves M1 and M2 reaching the surface of the Mo-electrode layer 2 of respective cells. In other words, unit cells can not reliably be separated from each others on the substrate.

Accordingly, the present invention provides the mechanical scribing apparatus with controlling force of the scribing cutter which is capable of detecting a wear loss of the tip face of the tapered body of the scribing cutter 9 by measuring a change in the size of the flat tip face portion 91 thereof and correspondingly increasing the pressure force applied to the cutter in such a way so as to always scribe the specified size of the grooves.

Figure 5:
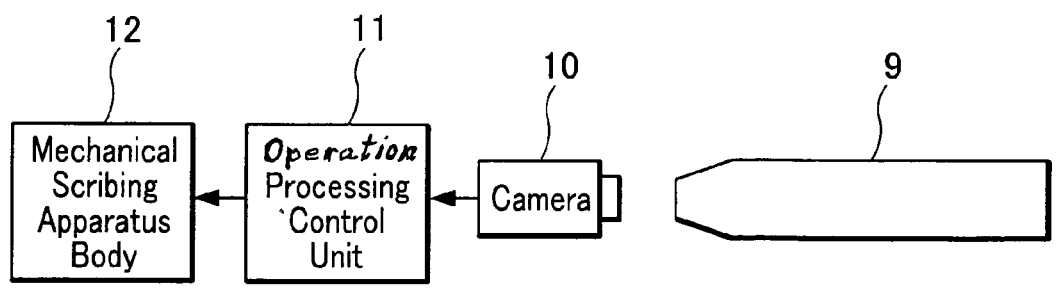
FIG. 5 illustrates an exemplary means for measuring the size of a flat surface of a scribing cutter.

In practice, the mechanical scribing apparatus with controlling force of a scribing cutter according to the present invention is provided with a means for measuring the flat tip face size of the cutter 9, which, as shown in FIG. 5, takes an image of the flat tip face portion of the cutter 9 by a camera 10 and determines the size (diameter or area) of the flat tip face portion 91 by performing operations on the measured date by an operation processing unit 11. In this case, the flat tip face portion 91 is recognized from the image data and the size of the flat tip face portion 91 is determined based on a ratio of the same portion 91 to a whole image. The mechanical scribing apparatus is also provided with means for controlling the force pressing the cutter 9 in accord with the measured size of the flat operation tip face portion 91. The operation processing unit 11 has a table containing preset data indicating pressures of the cutter 9 versus the sizes of its flat tip portion 91 and adjusts the pressure force of the cutter 9 to a specified value in accord with the measured size of the flat tip portion 91 of the cutter 9. In this case, an actuator (not shown) of a pressure control cylinder—piston mechanism of the mechanical scribing apparatus 12 is adaptively controlled under the control of the operation processing unit 11. The high accuracy of the pressure control in accord with a wear loss of the cutter 9 is achieved by the provision of a feedback control system which controls the mechanism while measuring the force of the cutter 9 by a load meter.

The mechanical scribing apparatus 12 has a standard type main body with a head with a cutter 9 movably attached thereto, which works by vertically pressing the cutter 9 with a specified force to a specified position of a work by using an actuator composed of a cylinder-piston mechanism and moving the cutter 9 along a specified cutting line on the surface of the work.

Figure 6:
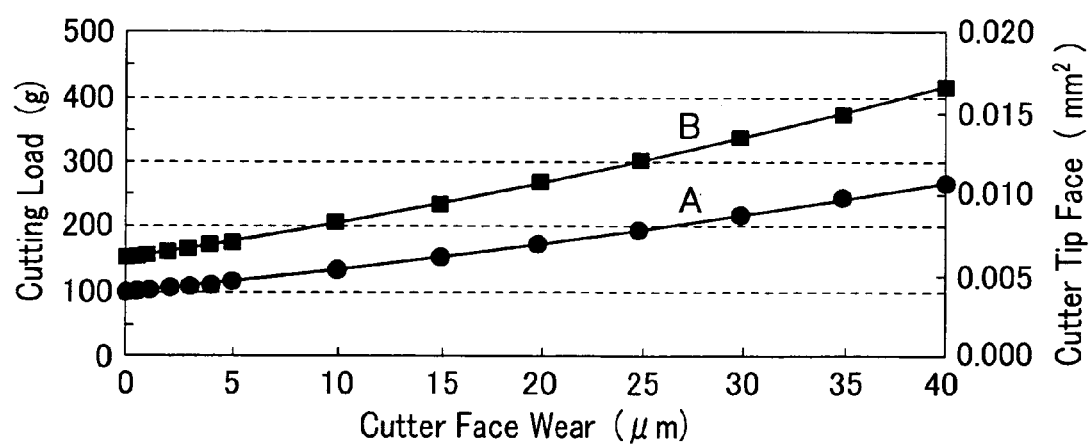
FIG. 6 is a graph showing a relation between a wear loss and a tip face size of a scribing cutter and an exemplary characteristic of a cutter load optimal to a wear loss of the scribing cutter.

FIG. 6 shows characteristic A of wear loss to tip face of the cutter 9 and characteristic B of optimal load to the cutter with respect to a wear loss of the tip face of the same cutter 9.

A wear loss of the cutter 9 may be also determined from the size of the flat tip portion 91 on the basis of the width of a scribe made and measured in the previous scribing step.

When conducting the mechanical scribing of a work, the speed of moving the cutter 9 is variably controlled under the control of the operation processing unit in such a way so as to increase the cutter moving speed in an intermediate scribing area between a starting area (about 10% of a whole area) and an ending area (about 10% of a whole area). Both the scribe starting and ending areas requires a high accuracy of positioning of the cutter 9 on the surface of the work.

Such increasing in speed of moving the cutter in the intermediate area of the work is useful for increasing throughput of the process of separating individual thin-film solar cells formed on a single substrate.

According to the present invention, the mechanical scribing is conducted on the surface of the work held in a state inclined at an angle of not less than 60° and less than 90° to a horizontal plane so that chips may be removed without falling on and adhering to the surface of the work. The inclination of the surface of the work 13 is limited not to exceed 90° from the horizontal so as not to fall out by itself.

Figure 7:
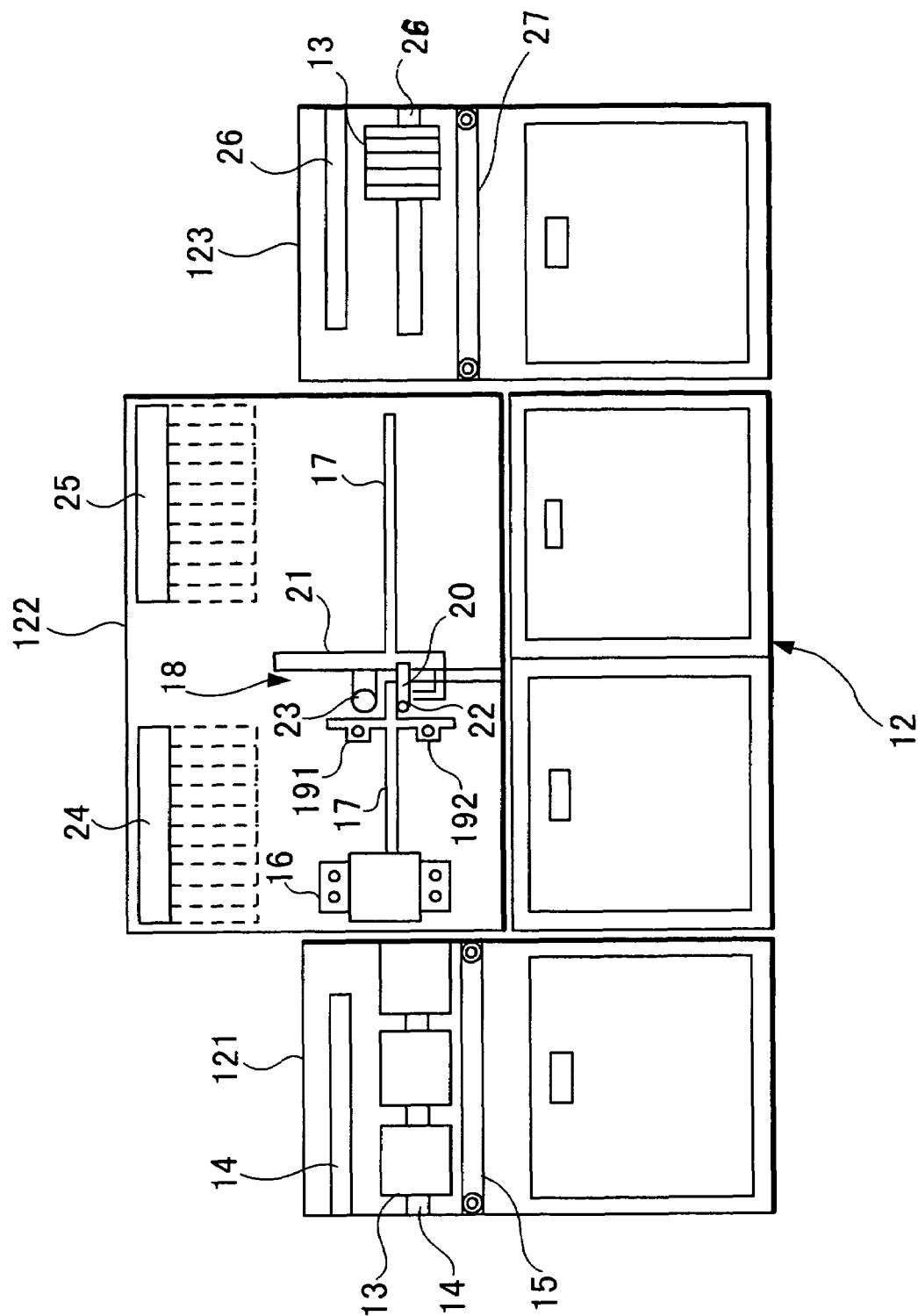
FIG. 7 is a schematic construction view of a mechanical scribing apparatus according to the present invention.

FIG. 7 is a schematic view of the main body of the mechanical scribing apparatus according to the present invention.

The mechanical scribing apparatus 12 comprises a back face float type loading portion L/L 121 for loading a work 13 held in a state inclined at an angle of not less than 60° and less than 90° to the horizontal, a scribing portion 122 for performing a predetermined scribing of the inclined surface of the work and a back face float type unloading portion UL/UL 123 for unloading the work 13 processed by the mechanical scribing.

In the loading portion L/L 121, a plurality of works 13 arranged with their surfaces held in vertical state by a back face airflow line 14 are transported subsequently by a conveyor 15 to the scribing portion 122.

Figure 8:
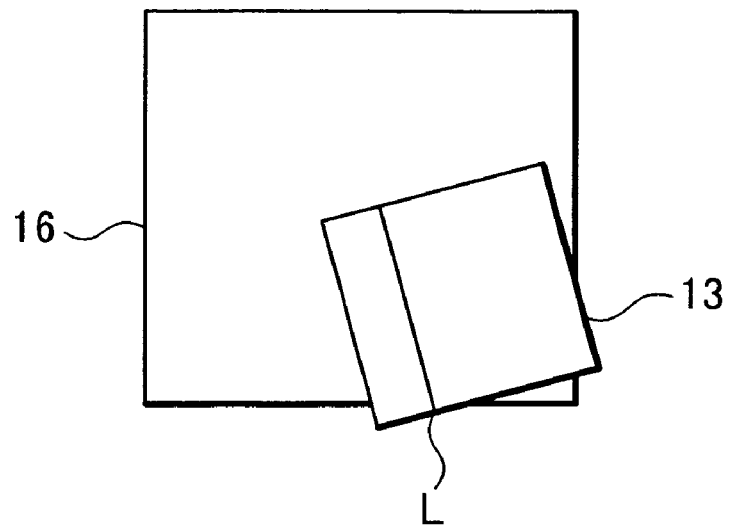
FIG. 8 is a front view showing an inclined state of a work which is vacuum sucked to a moving table of a mechanical scribing apparatus.
Figure 9:
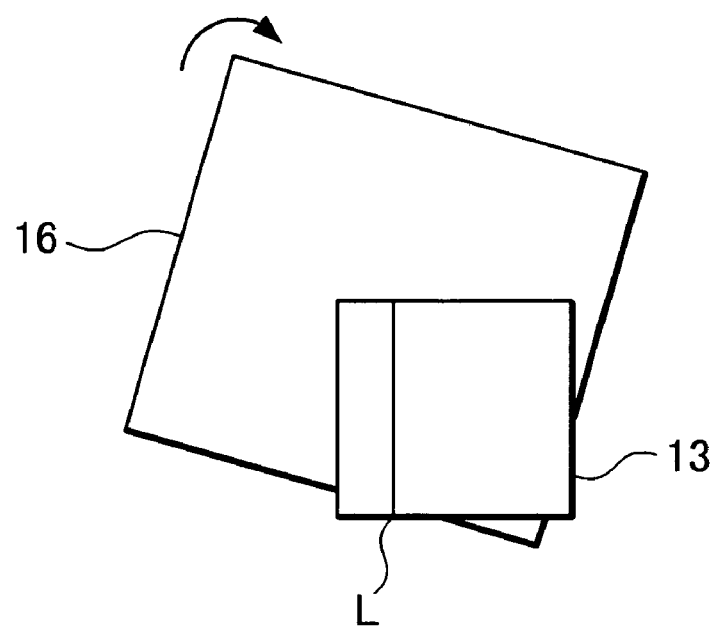
FIG. 9 is a front view showing a position of a work, which is adjusted by rotating a moving table with respect to a scribing actuator of a mechanical scribing apparatus.

In the scribing portion 122, each of works 13 as in the vertical state is vacuum sucked to a moving table 16 and transported along a slide rail 17 to an actuator 18 for scribing. In this position, the upper and lower ends of a scribed line (groove L) formed in the work by laser scribing in the preceding process is first recognized by a pair of cameras 191 and 192. In this case, if the work 13 sucked to the moving table 16 is inclined as shown in FIG. 8, the moving table 16 is rotated until the recognized scribed line is set to a vertical plane as shown in FIG. 9. Thus, the work 13 is placed in a state normal to the actuator 18. The work 13 is fed and the cutter is placed at a specified position for scribing. The mechanical scribing is then conducted by pressing a scribing head 20 having the cutter 22 with a specified force to the surface of the work 13 and moving the head 20 in the vertical direction along a head driving portion 21. In FIG. 7, numeral 23 designates a head cleaning device and numerals 24 and 25 designate down blow holes respectively.

In the unloading portion UL/UL 123, the works received from the scribing portion 122 are held by a back face airflow line 26 and subsequently unloaded by a conveyor 27.

INDUSTRIAL APPLICABILITY

As is apparent from the foregoing, the mechanical scribing apparatus with controlling force of scribing cutter according to the present invention measures the flat tip face size of a scribing cutter and controls the force pressing the cutter to the surface of a work, thereby it can always make minute predetermined scribing at a high accuracy on the surface of the work in accord with a wear loss of the cutter. In particular, the separation of each of solar cells formed on a single substrate is adaptively performed by the mechanical scribing apparatus without insufficient scribing and/or damaging the surfaces of the lower layers and the substrate.

Furthermore, the mechanical scribing apparatus with controlling force of scribing cutter according to the present invention can variably control the moving speed of the cutter in such as a way to increase the cutter moving speed in an intermediate scribing area between a starting area and an ending area so as to effectively increase the throughput of the scribing process.

The scribing can be performed on a work held as inclined at an angle of no less than 60° and less than 90°, thereby preventing adhesion of chips to the surface of the substrate during the scribing process.

The invention claimed is:

1. A mechanical scribing apparatus with controlling force of a scribing cutter comprising a means for conducting mechanical scribing by pressing a scribing cutter having a cylindrical body tapering at a specified angle to a scribing end and having a flat tip face with a specified pressure force to a specified position of a surface of a work and moving the cutter on the surface of the work, a means for measuring a size of the flat tip face of the scribing cutter and a means for controlling a force pressing the cutter to the work in accord with a measured size of the flat tip face of the scribing cutter to a specified value selectively read from a control memory table storing therein pressing forces predetermined for each of variable sizes of flat tip face of the scribing cutter.

2. A mechanical scribing apparatus with controlling force of a scribing cutter as defined in claim 1, characterized in that the measured size of a flat tip face of a scribing cutter is a diameter or an area thereof.

3. A mechanical scribing apparatus with controlling force of a scribing cutter as defined in claim 1, characterized in that the means for measuring the size of the flat tip face of a scribing cutter is provided with a camera portion for measuring the size of the flat tip face of the cutter.

4. A mechanical scribing apparatus with controlling force of a scribing cutter as defined in claim 3, characterized in that the camera portion determines the size of a flat tip face of a scribing cutter from an image of the cutter tip portion.

5. A mechanical scribing apparatus with controlling force of a scribing cutter as defined in claim 3, characterized in that the camera portion determines a width of a scribed groove previously made in a work surface from an image of the work and determines a size of a flat tip face of the scribing cutter from the width of the scribed groove.

6. A mechanical scribing apparatus as defined in claim 1, characterized in that mechanical scribing is conducted on a surface of a work being held in a state inclined at an angle of not less than 60° but less than 90° to horizontal plane.

* * * * *